(12) United States Patent
Becattini et al.

(10) Patent No.: US 10,211,721 B2
(45) Date of Patent: Feb. 19, 2019

(54) DC/AC CONVERTER APPARATUS COMPRISING MEANS FOR CONTROLLING THE REACTIVE POWER AND POWER CONVERSION AND GENERATION SYSTEM COMPRISING SUCH DC/AC CONVERTER APPARATUS

(71) Applicant: ABB Schweiz AG, Baden (CH)

(72) Inventors: Andrea Becattini, Cavriglia (IT); Sauro Macerini, Bucine (IT)

(73) Assignee: ABB Schweiz AG, Baden (CH)

( * ) Notice: Subject to any disclaimer, the term of this patent is extended or adjusted under 35 U.S.C. 154(b) by 218 days.

(21) Appl. No.: 15/227,544

(22) Filed: Aug. 3, 2016

(65) Prior Publication Data

US 2017/0040887 A1 Feb. 9, 2017

(30) Foreign Application Priority Data

Aug. 3, 2015 (EP) ..................... 15179469

(51) Int. Cl.
| | | |
|---|---|---|
| H02M 1/42 | (2007.01) | |
| G01R 21/133 | (2006.01) | |
| H02J 3/16 | (2006.01) | |
| H02J 3/18 | (2006.01) | |
| H02J 3/50 | (2006.01) | |
| G01R 21/00 | (2006.01) | |
| H02J 7/00 | (2006.01) | |

(Continued)

(52) U.S. Cl.
CPC ............ *H02M 1/42* (2013.01); *G01R 21/003* (2013.01); *G01R 21/1331* (2013.01); *H02J 3/16* (2013.01); *H02J 3/1842* (2013.01); *H02J 3/383* (2013.01); *H02J 3/50* (2013.01); *H02J 7/0068* (2013.01); *H02J 3/32* (2013.01); *H02J 3/382* (2013.01); *H02J 3/385* (2013.01); *H02M 2001/0009* (2013.01); *Y02E 10/58* (2013.01); *Y02E 40/22* (2013.01)

(58) Field of Classification Search
CPC ... H02M 1/42; G01R 21/003; G01R 21/1331; H02J 3/16; H02J 3/1842; H02J 3/383; H02J 3/50; H02J 7/0068; H02J 3/32; H02J 3/382
USPC .......................................... 307/20
See application file for complete search history.

(56) References Cited

U.S. PATENT DOCUMENTS

| | | | | |
|---|---|---|---|---|
| 9,787,170 B2 * | 10/2017 | Inoue | ........................ | G05F 1/67 |
| 9,912,150 B2 * | 3/2018 | Izumi | ........................ | H02J 1/00 |
| 2017/0187303 A1 * | 6/2017 | Raboni | ................... | H02M 1/14 |

FOREIGN PATENT DOCUMENTS

JP 2014033539 A 2/2014

OTHER PUBLICATIONS

European Patent Office, Extended Search Report issued in corresponding Application No. 15179469.0, dated Feb. 2, 2016, 12 pp.

(Continued)

*Primary Examiner* — Dinh T Le
(74) *Attorney, Agent, or Firm* — J. Bruce Schelkopf; Taft Stettinius & Hollister LLP

(57) ABSTRACT

A DC/AC converter apparatus is disclosed for converting DC power of a DC energy source into AC power for supplying a load and or the utility grid. The DC/AC converter apparatus is adapted to automatically control the amount of both active and reactive electrical power that is exchanged with the utility grid in order to optimize the electrical power usage of the micro grid.

20 Claims, 6 Drawing Sheets

(51) Int. Cl.
　　　*H02J 3/32*　　　(2006.01)
　　　*H02J 3/38*　　　(2006.01)
　　　*H02M 1/00*　　　(2006.01)

(56) References Cited

OTHER PUBLICATIONS

Peng et al., "COntrol and Protection of Power Electronics Interfaced Distributed Generation Systems in a Customer-Driven Microgrid," IEEE Power & Energy Society General Meeting, 2009, Pisctaway, New Jersey, 8 pp.

Serban et al., "Islanding Detection Search Sequence for Distributed Power Generators Under AC Grid Faults," IEEE Transactions on Power Electronics, vol. 30, No. 6, Jun. 2015, pp. 3106-3121.

* cited by examiner

DC/AC CONVERTER APPARATUS COMPRISING MEANS FOR CONTROLLING THE REACTIVE POWER AND POWER CONVERSION AND GENERATION SYSTEM COMPRISING SUCH DC/AC CONVERTER APPARATUS

TECHNICAL FIELD OF THE INVENTION

The present invention relates to a DC/AC converter apparatus and to a power conversion and generation system comprising such DC/AC converter apparatus. In particular, but not exclusively, the present invention relates to DC/AC conversion systems of the electrical power generated by photovoltaic systems and adapted to be connected directly to the power grid.

STATE OF THE ART

Distributed generation of energy is based on the integration of small-sized and medium-sized power generators which use new and renewable energy generation technologies—such as solar, wind, and fuel cells—to provide power to local users and to a utility grid. While conventional power stations, such as coal-fired, gas and nuclear powered plants, as well as hydroelectric dams and large-scale solar power stations, are centralized and often require electricity to be transmitted to the users over long distances, distributed generation systems are decentralized, modular, more flexible and located close to the load they serve, albeit having smaller capacities.

The distributed generation systems generally employ one or more micro grids for generating power. Micro grids are localized power generation systems that operate in connection with the utility grid. Said micro grids may work either connected to or disconnected from the main grid. When they are connected to the main grid they provide power to said main grid and to the connected loads, when they are disconnected from the main grid they function autonomously in an isolated mode, supplying only the connected load.

One example of micro grid is based on solar inverters, widely used for generating electrical energy in distributed generation systems by converting solar energy collected by solar cell panels. Said solar inverters are adapted to convert the DC input voltage generated from the solar cell panels into an AC output voltage characterized by amplitude and frequency as required by the power grid specifications. The DC/AC conversion provided by said solar inverters generally comprises two stages: a first DC/DC conversion to boost and regulate the DC voltage from the solar cell panels, and a second DC/AC conversion to provide the requested AC power. The first DC/DC conversion is generally accomplished by a booster DC/DC converter whereas said second conversion is generally accomplished by a DC/AC converter based on a high-frequency Pulse Width Modulation (PWM) inverter. Same topologies are successfully employed with DC power input from wind turbines or fuel cells as well.

On one side distributed generation systems offer great flexibility and means to manage the consumption of electrical power from the utility grid through the production of local electrical power at the micro grid. The active electrical power produced at the micro grid can be either consumed locally or provided to the utility grid thus reducing the overall consumption of the electrical power from the utility grid.

On the other side micro grid are not so convenient regarding reactive electrical power.

In alternating current (AC) circuits, reactive power is defined as the portion of power due to energy stored in inductors and capacitors of the circuit, which returns to the source in each cycle. If the load supplied by said source is purely resistive, voltage and current on the load are in phase, at every instant the product of voltage and current is positive, indicating that the direction of energy flow does not reverse, and the power on the load is only of active type. If the load supplied by said source is purely reactive, that is comprising only inductors or capacitors, then the voltage and current are 90 degrees out of phase. For half of each cycle, the product of voltage and current is positive, but on the other half of the cycle, the product is negative, indicating that on average, exactly as much energy flows toward the load as flows back. There is no net energy flow over one cycle. In this case, only reactive power flows and there is no active power transfer to the load. In practical cases loads have resistance, inductance, and capacitance, so both active and reactive power will flow to real loads. In this case apparent power is often measured, which is the magnitude of the vector sum of active and reactive power. The ratio between active power (usually measured in kilowatts, kW) and apparent power (usually measured in kilovolt-amperes, kVA) is called the power factor. Power factor ranges from 0 (for circuits comprising only inductors or capacitors) to 1 (for circuits comprising only resistors).

Utility grids provide the active power to their users and manage the reactive power flow as well. Reactive power flow, mostly due to electrical motors and fluorescent lamp ballasts, strongly influences the voltage levels and the losses across the network, therefore reactive power flow must be carefully controlled and limited to allow a power system to be operated properly, minimizing the network energy losses and ultimately the amount of greenhouse gases that are released into the atmosphere.

Managing the reactive power is a cost for the electric utility and therefore users may be charged if the loads they supply are such as causing relevant amounts of reactive power. This is referred to as "power factor charge". Electric utilities normally specify in their supply contracts a power factor lower limit for user's load not to be trespassed in order not to incur the costs of the reactive power exchanged between the user and the electric utility.

Alternatively, users may be requested by the electric utility to produce a certain amount of reactive power in order to stay within the power factor requested limits and not to be charged for trespassing them.

In the case of micro grids, the problem with reactive power is worse than for normal users. In fact, micro grids produce active power which is either consumed locally or sent to the utility grid. When the power produced by the micro grid is consumed locally to supply the local loads, the active power drawn by the utility grid decreases whereas the reactive power exchanged with said utility grid remains unchanged. As a result the power factor (equal to the ratio between active power and apparent power) decreases as well, possibly below the limit allowed by the utility and therefore a "power factor charge" might be applied to the micro grid user.

Some of the state of the art DC/AC conversion systems offer reactive power control: in case the utility needs to adjust the reactive power balance across its network and issues a request for limiting the overall reactive power to a micro grid, the user can change the operating mode of the DC/AC conversion system of the micro grid in order to limit reactive power according to the applicable standard, such as, for instance, CEI-021 or VDE AR-N4105.

In light of the situation outlined above, there is a need for an improved DC/AC converter apparatus, for converting DC power of a DC energy source into AC power for supplying a load and or the utility grid, while achieving automatic control of the amount of reactive power that is exchanged with said utility grid. Provided with automatic reactive power control, the DC/AC converter apparatus will not need to receive a request, by the utility manager, to provide reactive power in order to keep the power factor above a predetermined threshold. The reactive power of the micro grid local loads will be controlled and balanced real-time, at the grid connection point, with no need of intervention by the user. Moreover, the harmonic content of the produced AC power will be corrected and reduced accordingly.

It is therefore an object of the present invention to introduce an improved DC/AC converter apparatus, for converting DC power of a DC energy source into AC power for supplying a load and or the utility grid, adapted to automatically control the amount of both active and reactive electrical power that is exchanged with the utility grid in order to optimize the electrical power usage of the micro grid.

In terms of active power, optimizing the electrical power usage of the micro grid means:
  maximizing the amount of DC power from said renewable power source which is converted into AC power;
  maximizing the so-called self-consumption, defined as the ratio between the fraction of self-produced power (that is power produced within the micro grid) that is consumed by the user and the total amount of self-produced power;
  minimizing the exchange of reactive power between the micro grid and the utility grid.

In terms of reactive power, optimizing the electrical power usage of the micro grid means keeping the power factor above a predetermined threshold.

Further features and advantages of the present invention will be apparent in the following description of a non-limitative embodiment with reference to the figures in the accompanying drawings, which are diagrammatic and show functional blocks which are adapted to be made according to different circuitry solutions in practice. In detail:

DETAILED DESCRIPTION OF THE INVENTION

The DC/AC converter apparatus according to the present invention is adapted to convert an input DC voltage from a DC voltage source into an AC voltage to supply an AC load and to be fed into a utility grid, and it is further adapted to automatically control the amount of reactive power that is exchanged with said utility grid in order to keep the power factor above a predetermined threshold.

The DC voltage source may, for example, be a renewable source of energy like a photovoltaic system or a wind power system, but it may also be a fuel cell or a battery.

Figure 1:
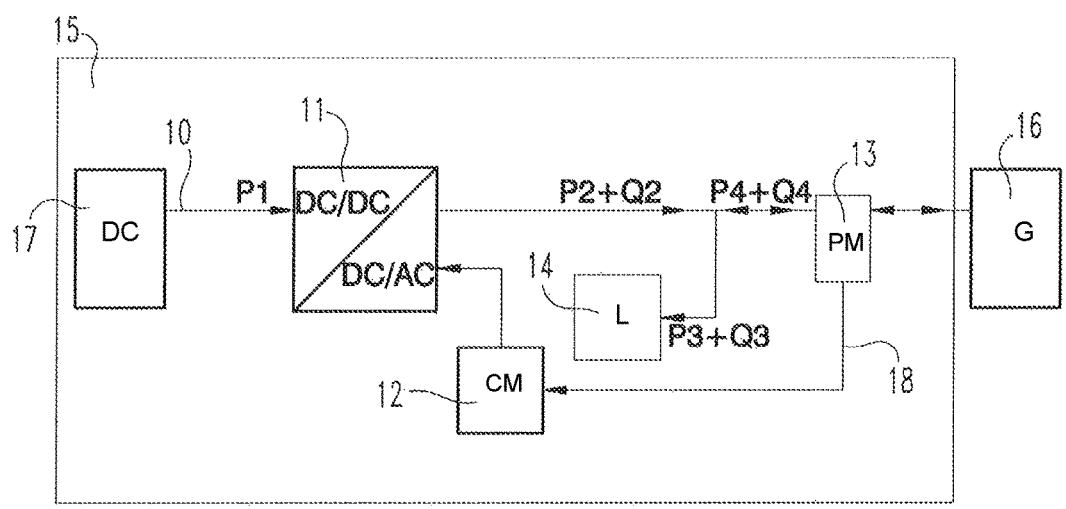
FIG. 1 illustrates a schematic diagram of a first preferred embodiment of the DC/AC converter apparatus according to the present invention installed in a residential micro grid.

The accompanying FIG. 1 illustrates a typical installation of a first preferred embodiment of the DC/AC converter apparatus according to the present invention in a residential micro grid 15. Home loads 14 may comprise a significant reactive part requiring a reactive power Q3 in addition to the active power P3. A bidirectional power meter 13 is adapted to measure both the active P4 and the reactive Q4 power that flow between the micro grid 15 and the utility grid 16.

The DC/AC converter apparatus according to the present invention can read, through suitable communication line, the power meter 13 and produce an active power P2—preferably employing, in case of photovoltaic source, an MPPT algorithm, thus maximizing the power flow from said renewable source P1—and a reactive power Q2.

The control module of the DC/AC converter apparatus according to the present invention will automatically produce the amount of reactive power Q2 necessary to balance the home loads reactive power Q3 demand, thus cancelling the reactive power Q4 that needs to be exchanged with the utility grid. This way the utility grid will not be affected by the home reactive loads, the residential micro grid will thus exchange only active power with the utility grid keeping the overall power factor close to 1 and avoiding the extra cost of power factor charge.

With reference to enclosed FIG. 1, a first preferred embodiment of the DC/AC converter apparatus according to the present invention comprises:
  Input terminals 10 adapted to connect to a DC voltage source 17 preferably comprising a renewable DC voltage source;
  An inverter module adapted to convert the voltage of said DC voltage source into an AC voltage for supplying a load and for delivering to a utility grid;
  A control module 12 adapted to manage and regulate the operation of said inverter module, said control module 12 being preferably associated to a user interface;
  Power meter means for measuring the active and reactive electrical power flowing to and from the utility grid, said means for measuring active and reactive electrical power being associated to said control module 12.

Said means for measuring active and reactive electrical power preferably comprise a bidirectional power meter device 13 suitably connected to said control module 12, through a wired or wireless data connection 18, for sending and receiving data related to the performed measurements and control settings.

Said inverter module may comprise a single stage or a double stage DC/AC inverter, said double stage DC/AC inverter comprising a DC/DC converter 11 and a cascaded DC/AC inverter 11bis.

The DC/DC converter is adapted to boost and/or regulate the DC voltage from the renewable DC voltage source in order to make it more stable and to optimize the power transfer from the renewable DC voltage source, preferably employing, in case of photovoltaic source, a suitable MPPT (Maximum Power Point Tracking) algorithm according to techniques well known in the art.

The cascaded DC/AC inverter is adapted to convert the DC voltage from said upstream DC/DC converter into an AC voltage adapted to be delivered to the utility grid and to supply AC loads within the micro grid.

The control module 12, by suitably interacting with said power meter means and with said DC/AC converter apparatus, is adapted to regulate the operation of said DC/AC converter apparatus in order to:
- maximize the amount of DC power from said renewable power source which is converted into AC power;
- maximize the so-called self-consumption, defined as the ratio between the fraction of self-produced power (that is power produced within the micro grid) that is consumed by the user and the total amount of self-produced power;
- minimize the amount of energy transferred from the micro grid to the utility grid;
- minimize the exchange of reactive power between the micro grid and the utility grid.

The optimal situation where the micro grid does not deliver energy to the utility grid at all is often referred to as "non-export", "zero export", "zero injection", "zero immission to grid" etc.

In general terms, the control module 12 of the apparatus according to the present invention allows adjusting the operation of said DC/AC converter apparatus so that the combination of the value of the active and reactive power produced by said DC/AC converter apparatus and of the value of the active and reactive power exchanged by said DC/AC converter apparatus with the utility grid, is approximately equal to a required value.

Figure 2:
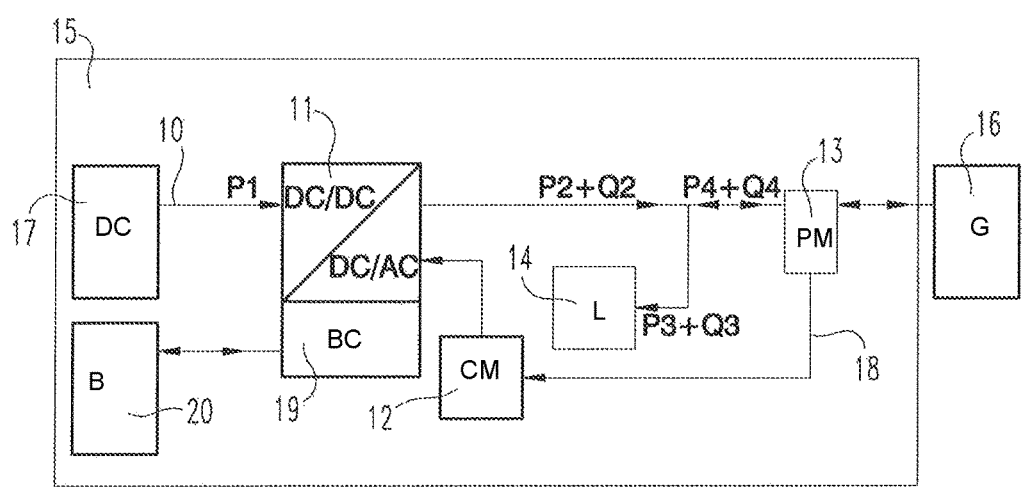
FIG. 2 illustrates a schematic diagram of a second preferred embodiment of the DC/AC converter apparatus according to the present invention installed in a residential micro grid.

In a second preferred embodiment of the DC/AC converter apparatus according to the present invention, depicted in accompanying FIG. 2, said DC/AC converter apparatus further comprises
- a battery-charger module 19 associated to and adapted to charge
- a battery module 20 adapted to store power from said inverter module, during charge, and to supply energy to said inverter module during discharge. In both cases, the control module 12 of the apparatus according to the present invention further manages to control the operation of said battery-charger module 19 and the charge and discharge of said battery module 20 in order to maximize the self-consumption within the micro grid: when the electrical power harvested from said DC voltage source 17 exceeds the local load power needs, then it is fed to the battery module 20 and stored. When the electrical power harvested from said DC voltage source 17 falls short the local load power needs, then the energy previously stored in said battery module 20 is fed back to said inverter module to be supplied to the local loads.

Said control module 12 implements a double regulation loop, an output current regulation loop and an input voltage regulation loop. The output current regulation loop is based on a current controller 31 adapted to sense the output AC current of the DC/AC converter apparatus $I_{Out}$ and control the generation of instantaneous output current of said DC/AC inverter 11bis according to the sensed current. The generation of instantaneous output current of DC/AC inverter 11bis is controlled such that the output AC current follows the reference current $I_{Ref}$.

The input voltage regulation loop is based on a voltage controller 30 adapted to sense the input voltage of said DC/AC inverter 11bis (output voltage of said DC/DC converter) and control the generation of the reference current $I_{Ret}$ with which the sensed current $I_{Out}$ is compared. The input voltage regulation loop can be further adapted to match the input voltage to a reference point provided by a suitable MPPT algorithm according to techniques well known to the person skilled in the art.

Figure 3:
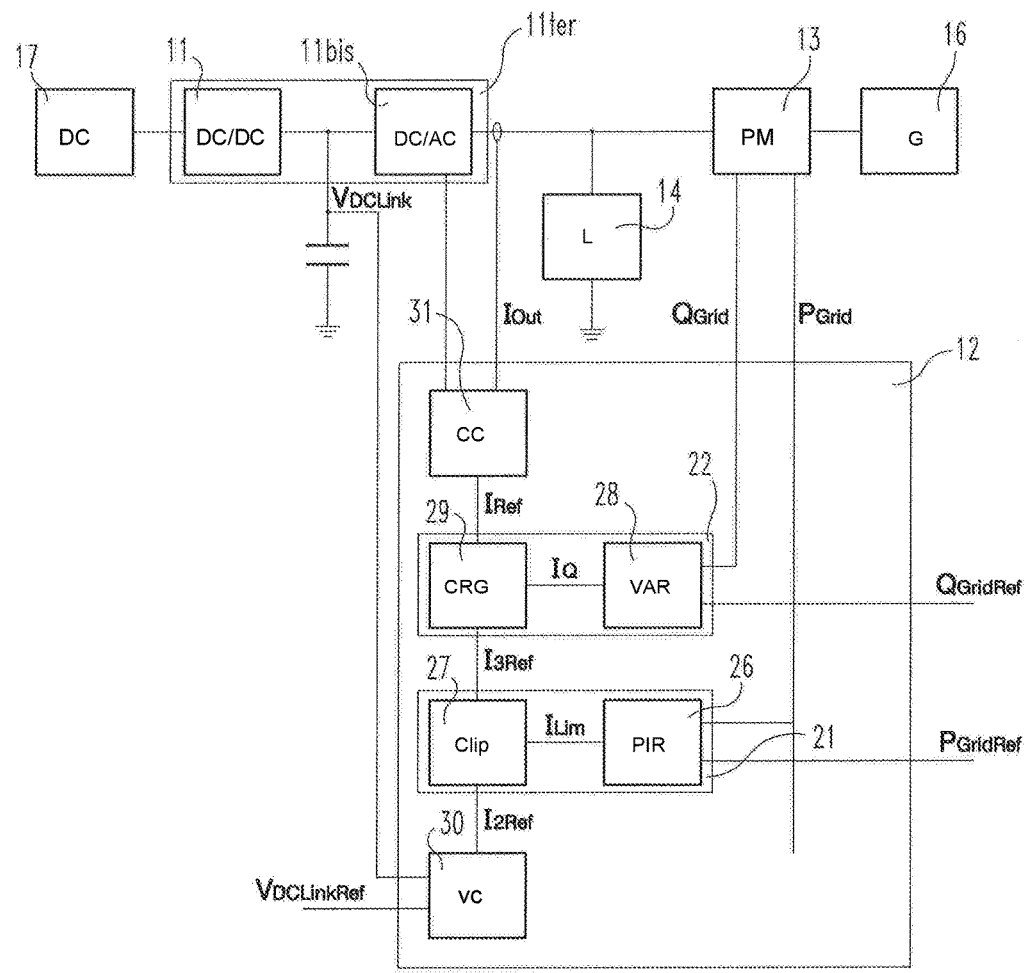
FIG. 3 illustrates a schematic diagram of a first preferred embodiment of the DC/AC converter apparatus according to the present invention showing a first preferred embodiment of the controller of said DC/AC converter apparatus.

Furthermore, with reference to the accompanying FIG. 3, illustrating a first preferred embodiment of the apparatus according to the present invention showing a first preferred embodiment of the control module 12 of said DC/AC converter apparatus according to the present invention, said control module 12 comprises an active power controller 21 and a reactive power controller 22 placed between said output current regulation loop and said input voltage regulation loop.

In greater detail, enclosed FIG. 3 shows a first preferred embodiment of said control module 12 comprising:
- a current controller 31 adapted to sense the output AC current of said inverter module $I_{Out}$ (output AC current of said DC/AC inverter 11bis) and control the generation of instantaneous output current of said inverter module (output AC current of said DC/AC inverter 11bis) according to the sensed current and to a reference current value $I_{Ref}$;
- a voltage controller 30 adapted to sense the input voltage of said DC/AC inverter 11bis (output voltage of said DC/DC converter) and control the generation of the reference current $I_{Ret}$ with which the sensed current $I_{Out}$ is compared;
- an active power controller 21 adapted to control the active power output of the DC/AC converter apparatus according to the present invention and
- a reactive power controller 22 adapted to control the reactive power output of the DC/AC converter apparatus according to the present invention.

Said control module 12 is adapted to control the operation of the DC/AC converter apparatus according to the present invention by providing current regulation which drives the DC/AC inverter 11bis to operate in the one or more predefined modes. A control operation of said control module 12 senses the current $I_{Out}$ at the output of the DC-AC inverter 11bis. Thereafter, the current $I_{Out}$ is provided to the current controller 31 that compares the sensed current $I_{Out}$ and a reference current $I_{Ref}$. The reference current $I_{Ref}$ comprises a current magnitude and a current wave shape information and it represents the current that is required to flow into the load 14 and into the AC grid 16. According to the present invention, said reference current $I_{Ref}$ is generated with the contribution of said voltage controller 30, said active power controller 21 and said reactive power controller 22.

The voltage controller 30 is adapted to sense the input voltage of said DC/AC inverter 11bis (output voltage of said DC/DC converter), compare it with a reference voltage $V_{DClinkRef}$ and control the generation of a second reference current $I_{2Ref}$.

The second reference current $I_{2Ref}$ is then fed to said active power controller 21 together with a reference value of a first active output power $P_{gridRef}$. The active power controller 21 senses, from said bidirectional power meter device 13, the actual active output power $P_{grid}$ and processes it together with the second current reference $I_{2Ref}$ and said first active power reference $P_{gridRef}$ to calculate a third current reference $I_{3Ref}$.

The third current reference $I_{3Ref}$ is then fed to said reactive power controller 22 together with a reference value of reactive output power $Q_{gridRef}$. The reactive gridRef power controller 22 senses, from said bidirectional power meter device 13, the actual reactive output power $Q_{grid}$ and processes it together with the second reference data $I_{d2Ref}$ and a reactive power reference $Q_{gridRef}$ to calculate said reference current $I_{Ref}$.

In greater detail, the active power controller 21 comprises a grid power injection regulator 26 and a current clipper module 27. The grid power injection regulator 26 is adapted to sense, from said bidirectional power meter device 13, the actual active output power $P_{grid}$ and compare it with a reference value of active output power $P_{gridRef}$, the result is further processed to generate a first auxiliary current reference $I_{lim}$ which is fed to said current clipper module 27 to be compared with said second reference current $I_{2Ref}$ generated by said voltage controller 30. The comparison within current clipper module 27 generates said third current reference $I_{3Ref}$.

The reactive power controller 22 comprises a VAR regulator 28 and a current reference generator module 29. The VAR regulator 28 is adapted to sense, from said bidirectional power meter device 13, the actual reactive output power $Q_{grid}$ and compare it with a reference value of reactive output power $Q_{gridRef}$, the result is further processed to generate a second auxiliary current reference $I_q$ which is fed to said current reference generator module 29 to be compared with said third reference current $I_{3Ref}$ generated by said active power controller 21. The result of that comparison generates said reference current $I_{Ref}$ to be processed by said current controller 31 to close the current regulation loop of said DC/AC inverter 11bis.

The positions of said active power controller 21 and reactive power controller 22 can be exchanged within the control loop of the control module 12, without departing from the scope of the invention and in order to prioritize the active power regulation over the reactive power regulation or vice-versa.

Figure 4:
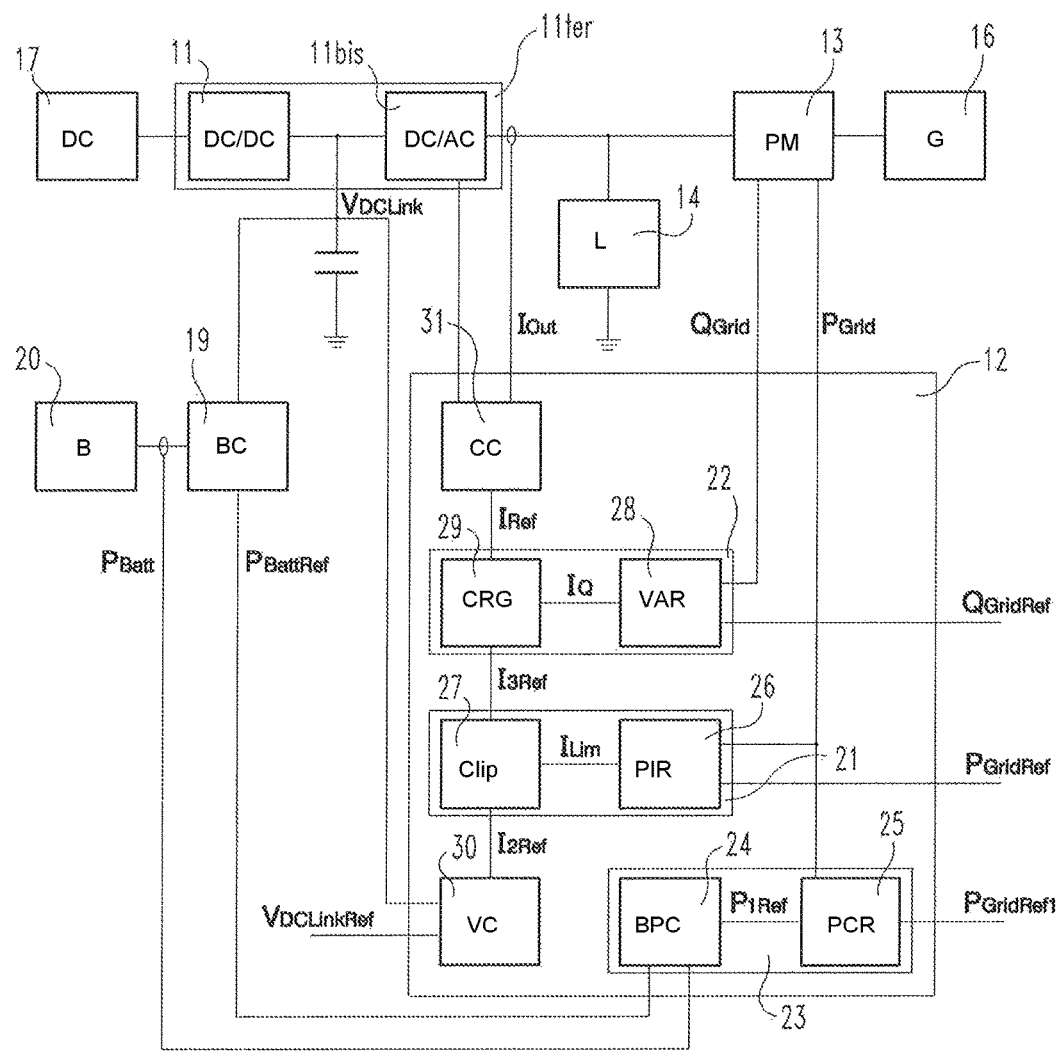
FIG. 4 illustrates a schematic diagram of a second preferred embodiment of the apparatus according to the present invention showing a second preferred embodiment of the controller of said DC/AC converter apparatus.

With reference to the accompanying FIG. 4, a second preferred embodiment of the apparatus according to the present invention further comprises a battery module 20 and a battery charger 19. Accordingly, said control module 12 further comprises a battery power manager 23. Said battery module 20 and battery power manager 23 allow adding to the DC/AC converter apparatus according to the present invention further flexibility towards the optimization of the power usage of the micro grid.

The battery power manager 23 is adapted to control the charge and discharge operation of the battery charger 19 according to the settings and the requirements by the user.

If the requirement is to maximize the self-consumption within the micro grid, when the electrical power harvested from said DC voltage source 17 exceeds the local load power needs, then the battery power manager 23 will set the battery charger 19 in its charge mode in order to store the energy excess into the battery module 20. When, on the opposite, the electrical power harvested from said DC voltage source 17 falls short the local load power needs, then the battery power manager 23 will set the battery charger 19 in its discharge mode in order to convey the energy previously stored in said battery module 20 to said inverter module to be supplied to the local loads.

In greater detail and with reference to accompanying FIG. 4, the battery power manager 23 comprises a power consumption regulator 25 and a battery power controller 24. The power consumption regulator 25 is adapted to sense, from said bidirectional power meter device 13, the actual active output power $P_{grid}$ and compare it with a second reference value of active output power $P_{GridRef1}$. The result is further processed to generate an intermediate battery power reference $P_{1Ref}$. Said intermediate battery power reference $P_{1Ref}$ is then fed to the battery power controller 24 to be compared with the actual battery power $P_{Batt}$, the power being delivered to or from said battery module 20 as sensed by said battery power controller 24. The result of the comparison leads to the generation of a battery power reference $P_{BattRef}$ that will be fed to said battery charger 19 to close the battery charger power regulation loop and drive the battery module 20 to charge or discharge mode according to the setting requirements.

Figure 5:
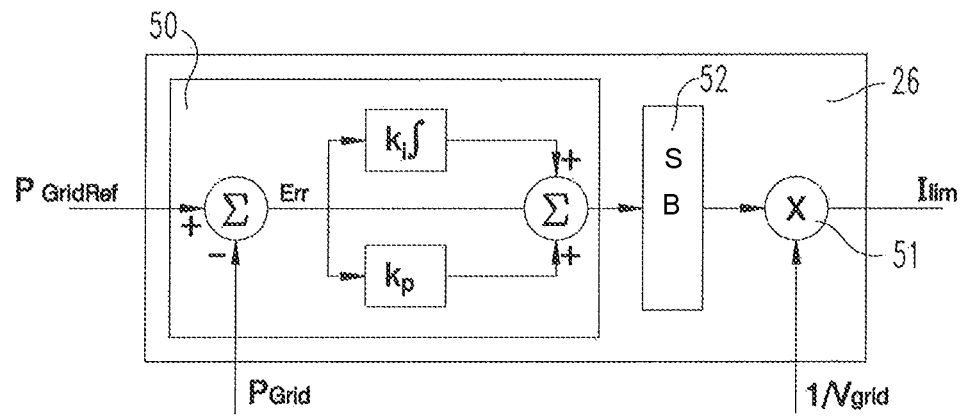
FIG. 5 illustrates a preferred embodiment of a section of the control module of the DC/AC converter apparatus according to the present invention, the grid power injection regulator.
Figure 6:
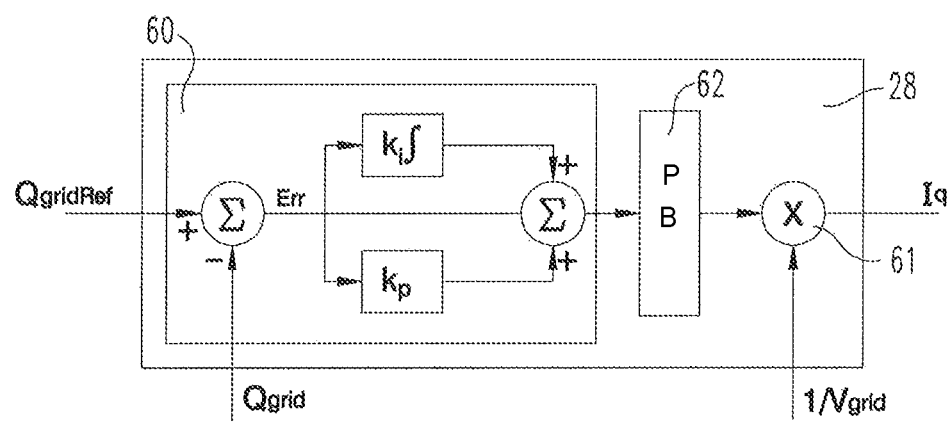
FIG. 6 illustrates a preferred embodiment of a section of the control module of the DC/AC converter apparatus according to the present invention, the VAR regulator.
Figure 7:
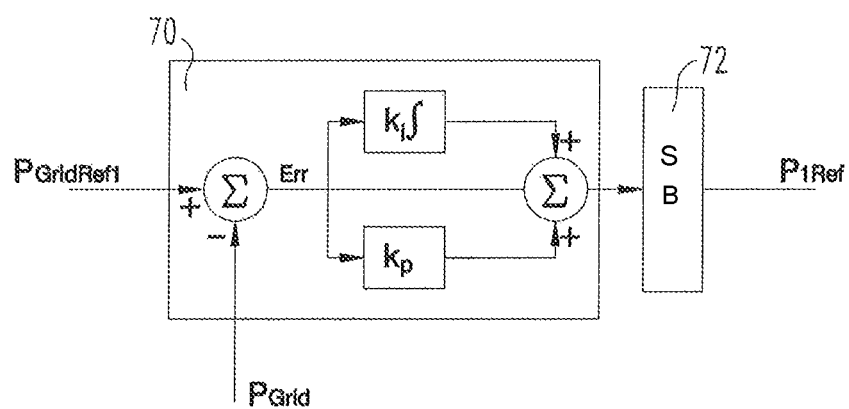
FIG. 7 illustrates a preferred embodiment of a section of the control module of the DC/AC converter apparatus according to the present invention, the power consumption regulator.

In further detail, with reference to accompanying FIGS. 5 to 7, said grid power injection regulator 26 preferably comprises a proportional-integral controller (P-I controller) 50 adapted to calculate an error value (Err) as the difference between a measured process variable ($P_{grid}$) and a desired setpoint ($P_{gridRef}$). The P-I controller 50 attempts to minimize said error by adjusting the process through use of its output manipulated variable. Being said P-I controller processes variables and setpoints expressed in terms of power, a multiplier block 51 is cascaded to said P-I controller 50 adapted to multiply the P-I controller 50 output variable by the inverse of the grid voltage in order to get to the first auxiliary current reference value $I_{lim}$. Furthermore a saturation block 52 is preferably connected to the output of the P-I controller 50 in order to limit the output signal of said P-I controller 50 to a maximum value compatible with the hardware features of the DC/AC converter apparatus.

Said current clipper module 27 can be implemented by a simple comparator adapted to detect and output said third auxiliary current reference value $I_{3Ref}$ as the lower between said first auxiliary current reference $I_{lim}$ and said second current reference $I_{2Ref}$.

Said VAR regulator 28 preferably comprises a P-I controller 60 cascaded by a multiplier block 61. The P-I controller 60 processes variables and setpoints expressed in terms of reactive power and the multiplier block 61 is adapted to multiply the P-I controller 60 output variable by the inverse of the grid voltage in order to get to said second auxiliary current reference $I_q$. The processing block 62 is adapted to calculate the maximum allowable reactive power as: $Q_{Max} = \sqrt{(S_{Max})^2 - (P)^2}$, wherein $S_{Max}$ is the maximum value of apparent power, P is the actual value of active power and $Q_{max}$ is the resulting maximum allowable reactive power from the DC/AC converter apparatus.

Said current reference generator module 29 preferably comprises a sinusoidal signal adder adapted to calculate said reference current $I_{Ref}$ through the combination of two input signals, said second auxiliary current reference $I_q$ and said third auxiliary current reference $I_{3Ref}$ according to the equation:

$$I_{Ref} = \sqrt{(I3\text{Ref})^2 + (Iq)^2}.$$

Finally, said power consumption regulator 25 preferably comprises a P-I controller 70. The P-I controller 70 processes variables and setpoints expressed in terms of active power. A saturation block 72 is preferably connected to the output of the P-I controller 70 in order to limit the output signal of said P-I controller 70 to a maximum value compatible with the hardware features of the DC/AC converter apparatus.

As explained before, the actual active output power $P_{grid}$ and the reference value of active output power $P_{GridRef}$ are processed to generate an intermediate battery power reference $P_{1Ref}$. Said intermediate battery power reference $P_{1Ref}$ is then fed to the battery power controller 24 to be compared with the actual battery power $P_{Batt}$, sensed by the battery power controller 24. The result of the comparison leads to the generation of a battery power reference $P_{BattRef}$ that will be fed to said battery charger 19 to close the battery charger power regulation loop and drive the battery module 20 to charge or discharge mode according to the setting requirements.

The invention claimed is:

1. DC/AC converter apparatus comprising:
    input terminals adapted to connect to a DC voltage source;
    an inverter module adapted to convert a voltage of said DC voltage source into an AC voltage for supplying a load and for delivering to
    a utility grid, said inverter module comprising a DC/DC converter and a cascaded DC/AC inverter;
    a control module connected to said inverter module and adapted to manage and regulate operation of said inverter module;
    power meter means for measuring active and reactive electrical power flowing to and from the utility grid, said power meter means for measuring the active and reactive electrical power being associated to said control module;
    said control module comprises:
    a current controller connected to said DC/AC inverter and adapted to sense the output AC current of said DC/AC inverter and control generation of instantaneous output current of said DC/AC inverter according to a sensed current and to a reference current value;
    a voltage controller connected to said DC/AC inverter and adapted to sense the input voltage of said DC/AC inverter and control generation of said reference current value;
    an active power controller connected to said DC/AC converter apparatus and adapted to control the active power output of said DC/AC converter apparatus by controlling the generation of said reference current value and
    a reactive power controller connected to said DC/AC converter apparatus and adapted to control the reactive power output of said DC/AC converter apparatus by controlling the generation of said reference current value.

2. DC/AC converter apparatus according to claim 1 further comprising:
    a battery-charger module connected to a battery module and adapted to charge said battery module, said battery module being connected to said inverter module and adapted to store power from said inverter module, during charge, and to supply energy to said inverter module during discharge.

3. DC/AC converter apparatus according to claim 1 wherein the power meter means for measuring the active and reactive electrical power flowing to and from the utility grid comprise a bidirectional power meter device-connected to said control module, through a wired or wireless data connection, for sending and receiving data related to performed measurements and control settings.

4. DC/AC converter apparatus according to claim 1 wherein said control module is adapted to provide current regulation which drives said DC/AC converter apparatus to operate in one or more pre-defined modes chosen in the group comprising:
    maximizing the amount of DC power from said DC voltage source which is converted into AC power;
    maximizing the self-consumption, defined as the ratio between the fraction of power produced by said DC/AC converter apparatus that is consumed by the user and the total amount of power produced by said DC/AC converter apparatus;
    minimizing the amount of energy transferred from said DC/AC converter apparatus to the utility grid;
    minimizing the exchange of reactive power between said DC/AC converter apparatus and the utility grid;
    adjusting the operation of said inverter module so that the combination of the value of the active and reactive power produced by said DC/AC converter apparatus and of the value of the active and reactive power exchanged by said DC/AC converter apparatus with the utility grid, is equal to a required value.

5. DC/AC converter apparatus according to claim 1 wherein:
    said voltage controller is adapted to sense the input voltage of said DC/AC inverter, compare it with a reference voltage and control the generation of a second current reference;
    said active power controller is adapted to sense the actual active power from said power meter means and to process said actual active output power together with said second current reference and a first active power reference to calculate a third current reference;
    said reactive power controller is adapted to sense the actual reactive output power from said power meter means and to process said actual active output power together with said third current reference and a reactive power reference to calculate said current reference.

6. DC/AC converter apparatus according to claim 5 wherein:
    said active power controller comprises a grid power injection regulator and a current clipper module, said grid power injection regulator being adapted to sense, from said power meter means, the actual active output power and compare said actual active output power with a first active power reference to generate a first auxiliary current reference; said current clipper module is adapted to compare said first auxiliary current reference with said second reference current to generate said third current reference;
    said reactive power controller comprises a VAR regulator and a current reference generator module, said VAR regulator being adapted to sense, from said power meter means, the actual reactive output power and compare said actual reactive output power with a reference value of reactive output power to generate a second auxiliary current reference; said current reference generator module being adapted to compare said second auxiliary current reference to said third reference current to generate said reference current.

7. DC/AC converter apparatus according to claim 2 wherein:
    said control module further comprises a battery power manager in turn comprising a power consumption regulator and a battery power controller, said power consumption regulator being adapted to sense, from said power meter means, the actual active output power and compare it with a second reference value of active output power to generate an intermediate battery power reference;

said battery power controller being adapted to sense the actual battery power and compare said actual battery power to said intermediate battery power reference to generate a battery power reference adapted to be fed to said battery charger to close the battery charger power regulation loop and drive the battery module to charge or discharge mode according to the setting requirements.

8. DC/AC converter apparatus according to claim 6 wherein said grid power injection regulator comprises:
- a proportional-integral controller adapted to calculate an error value as the difference between a measured process variable and a desired setpoint;
- a multiplier block cascaded to said P-I controller and adapted to multiply the P-I controller output variable by the inverse of the grid voltage in order to generate said first auxiliary current reference value.

9. DC/AC converter apparatus according to claim 6 wherein said current clipper module comprises a comparator adapted to generate said third auxiliary current reference value as the lower between said first auxiliary current reference and said second current reference.

10. DC/AC converter apparatus according to claim 6 wherein said VAR regulator comprises:
- a proportional-integral controller adapted to calculate an error value as the difference between the actual reactive output power and the reference value of reactive output power and to calculate the maximum allowable reactive power as:

$$Q_{Max} = \sqrt{(S_{Max})^2 - (P)^2}$$

wherein $S_{Max}$ is the maximum value of apparent power, P is the actual value of active power and $Q_{Max}$ is the resulting maximum allowable reactive power from the DC/AC converter apparatus;
- a multiplier block adapted to multiply said proportional-integral controller output variable by the inverse of the grid voltage in order to get to generate second auxiliary current reference.

11. DC/AC converter apparatus according to claim 6 wherein said current reference generator module comprises a sinusoidal signal adder adapted to calculate said reference current through the combination of said second auxiliary current reference and said third auxiliary current reference according to the equation:

$$I_{Ref} = \sqrt{(I3\text{Ref})^2 + (Iq)^2}.$$

12. DC/AC converter apparatus according to claim 6 wherein said power consumption regulator comprises a proportional-integral controller adapted to calculate an intermediate battery power reference through the processing of the actual active output power and the reference value of active output power.

13. DC/AC converter apparatus according to claim 2 wherein the power meter means for measuring the active and reactive electrical power flowing to and from the utility grid comprise a bidirectional power meter device connected to said control module, through a wired or wireless data connection, for sending and receiving data related to performed measurements and control settings.

14. DC/AC converter apparatus according to claim 2 wherein said control module is adapted to provide current regulation which drives said DC/AC converter apparatus to operate in one or more pre-defined modes chosen in the group comprising:
- maximizing the amount of DC power from said DC voltage source which is converted into AC power;
- maximizing the self-consumption, defined as the ratio between the fraction of power produced by said DC/AC converter apparatus that is consumed by the user and the total amount of power produced by said DC/AC converter apparatus;
- minimizing the amount of energy transferred from said DC/AC converter apparatus to the utility grid;
- minimizing the exchange of reactive power between said DC/AC converter apparatus and the utility grid;
- adjusting the operation of said inverter module so that the combination of the value of the active and reactive power produced by said DC/AC converter apparatus and of the value of the active and reactive power exchanged by said DC/AC converter apparatus with the utility grid, is equal to a required value.

15. DC/AC converter apparatus according to claim 2 wherein:
- said voltage controller is adapted to sense the input voltage of said DC/AC inverter, compare it with a reference voltage and control the generation of a second current reference;
- said active power controller is adapted to sense the actual active power from said power meter means and to process said actual active output power together with said second current reference and a first active power reference to calculate a third current reference;
- said reactive power controller is adapted to sense the actual reactive output power from said power meter means and to process said actual active output power together with said third current reference and a reactive power reference to calculate said current reference.

16. DC/AC converter apparatus according to claim 3 wherein:
- said control module further comprises a battery power manager in turn comprising a power consumption regulator and a battery power controller, said power consumption regulator being adapted to sense, from said power meter means, the actual active output power and compare it with a second reference value of active output power to generate an intermediate battery power reference;
- said battery power controller being adapted to sense the actual battery power and compare said actual battery power to said intermediate battery power reference to generate a battery power reference adapted to be fed to said battery charger to close the battery charger power regulation loop and drive the battery module to charge or discharge mode according to the setting requirements.

17. DC/AC converter apparatus according to claim 7 wherein aid grid power injection regulator comprises:
- a proportional-integral controller adapted to calculate an error value as the difference between a measured process variable and a desired setpoint;
- a multiplier block cascaded to said P-I controller and adapted to multiply the P-I controller output variable by the inverse of the grid voltage in order to generate said first auxiliary current reference value.

18. DC/AC converter apparatus according to claim 7 wherein said VAR regulator comprises:

a proportional-integral controller adapted to calculate an error value as the difference between the actual reactive output power and the reference value of reactive output power and to calculate the maximum allowable reactive power as:

$$Q_{Max} = \sqrt{(S_{Max})^2 - (P)^2}$$

wherein $S_{Max}$ is the maximum value of apparent power, P is the actual value of active power and $Q_{Max}$ is the resulting maximum allowable reactive power from the DC/AC converter apparatus;

a multiplier block adapted to multiply said proportional-integral controller output variable by the inverse of the grid voltage in order to get to generate second auxiliary current reference.

19. A power conversion and generation system adapted to produce and deliver AC power to a single phase AC grid comprising:
   a power generation unit for producing DC power; and
   a DC/AC converter apparatus comprising:
   input terminals adapted to connect to a DC voltage source;
   an inverter module adapted to convert a voltage of said DC voltage source into an AC voltage for supplying a load and for delivering to a utility grid, said inverter module comprising a DC/DC converter and a cascaded DC/AC inverter;
   a control module connected to said inverter module and adapted to manage and regulate operation of said inverter module;
   power meter means for measuring active and reactive electrical power flowing to and from the utility grid, said power meter means for measuring the active and reactive electrical power being associated to said control module;
   said control module comprises:
   a current controller connected to said DC/AC inverter and adapted to sense the output AC current of said DC/AC inverter and control generation of instantaneous output current of said DC/AC inverter according to a sensed current and to a reference current value;
   a voltage controller connected to said DC/AC inverter and adapted to sense the input voltage of said DC/AC inverter and control generation of said reference current value;
   an active power controller connected to said DC/AC converter apparatus and adapted to control the active power output of said DC/AC converter apparatus by controlling the generation of said reference current value and
   a reactive power controller connected to said DC/AC converter apparatus and adapted to control the reactive power output of said DC/AC converter apparatus by controlling the generation of said reference current value.

20. The power conversion and generation system according to claim 19 wherein said power generation unit is a photovoltaic power generation unit.

* * * * *